(12) United States Patent
Carr

(10) Patent No.: US 7,589,465 B2
(45) Date of Patent: Sep. 15, 2009

(54) GETTER MATERIAL

(75) Inventor: Joseph N. Carr, Chapel Hill, NC (US)

(73) Assignee: Osram Opto Semiconductors GmbH, Regensburg (DE)

( * ) Notice: Subject to any disclaimer, the term of this patent is extended or adjusted under 35 U.S.C. 154(b) by 463 days.

(21) Appl. No.: 11/052,943

(22) Filed: Feb. 7, 2005

(65) Prior Publication Data
US 2006/0033433 A1    Feb. 16, 2006

Related U.S. Application Data

(60) Provisional application No. 60/601,741, filed on Aug. 12, 2004.

(51) Int. Cl.
*H01J 19/70*    (2006.01)

(52) U.S. Cl. .......................... 313/546; 313/549; 313/553
(58) Field of Classification Search .................. None
See application file for complete search history.

(56) References Cited

U.S. PATENT DOCUMENTS

| | | | | |
|---|---|---|---|---|
| 5,591,379 | A  * | 1/1997 | Shores | 252/194 |
| 6,958,260 | B2 * | 10/2005 | Bedinger et al. | 438/115 |
| 7,022,158 | B2 * | 4/2006 | Seguin et al. | 95/90 |
| 7,193,364 | B2 * | 3/2007 | Klausmann et al. | 313/512 |
| 2002/0181866 | A1 * | 12/2002 | Crook et al. | 385/37 |

* cited by examiner

*Primary Examiner*—Ashok Patel
(74) *Attorney, Agent, or Firm*—Cohen Pontani Lieberman & Pavane LLP

(57) ABSTRACT

An embodiment of an encapsulated organic optoelectronic device is described. The encapsulated device includes a hybrid getter film which is composed of a getter and a handling agent.

9 Claims, 2 Drawing Sheets

GETTER MATERIAL

RELATED APPLICATIONS

This application claims priority from a provisional patent application filed on Aug. 12, 2004, entitled "Novel Getter Material", having application No. 60/601,741.

BACKGROUND

An organic optoelectronic device is, for example, an organic light emitting diode ("OLED") display, an OLED light source used for general purpose lighting, an organic light sensor array, an organic solar cell array, or an organic laser. The OLED display can be, for example, a passive matrix display, an alpha-numeric OLED display, or an active matrix OLED display. In the specific case of the OLED display, the display is typically comprised of an anode layer and a cathode layer where the anode layer is typically patterned to form multiple anode strips and cathode layer is patterned to form multiple cathode strips. The anode strips intersect the cathode strips, and pixels are formed at the intersections of the anode strips and the cathode strips by sandwiching one or more organic layers between the anode strips and the cathode strips. The one or more organic or semi-organic layers sandwiched between the anode and cathode include a light emitting layer which emits light upon charge recombination.

The organic optoelectronic device requires protection from reactive agents such as water vapor in the atmosphere, and therefore employ some form of encapsulation. One common procedure to encapsulate the organic electronic device is to sandwich it between a substrate and an encapsulation lid, and a continuous adhesive layer around the perimeter of the device bonds together the substrate and the encapsulation lid such that the device is sealed. The adhesive layer is typically not impermeable to oxygen and particularly not to moisture, so the encapsulated device package will generally have some finite permeation rate. These reactive gases that permeate through the adhesive layer react with the cathode layer and prevent electron injection at the sites of reaction. The reactive gasses that permeate through the adhesive seal react with the cathode layer at, for example, pinholes in the cathode layer or at the edges of the cathode strips. Eventually, the sites of reaction reach some specified quantity, and the device is considered no longer useable.

Employing getter materials inside the package can extend the useable lifetime of the device. These getter materials absorb and/or react with the water vapor that would otherwise harmfully react with other OLED materials. Typical getter materials include zeolite, zeolitic clays, CaO particles, BaO particles, Ba metals and so on.

Zeolite getters are thin tablets made of compressed clay that are thermally activated just prior to being placed in the OLED packaging (prior to being encapsulated). Thermal activation is performed in an oven at temperatures from nominally 250 to 400 degrees C. Once thermally activated, the tablets should remain in a moisture-free (<10 ppm water vapor) environment until sealed in the OLED package. Because the tablets have minimal binding agents to maintain their structural integrity, the tablets are highly prone to particle sloughing. The fragile nature of the compressed clay tablets makes them extremely difficult to handle and place into the OLED package. Particle sloughing and tablet breakage cause an unacceptable amount of particles to be generated in the process, resulting in significant yield losses.

DETAILED DESCRIPTION

Figure 1:
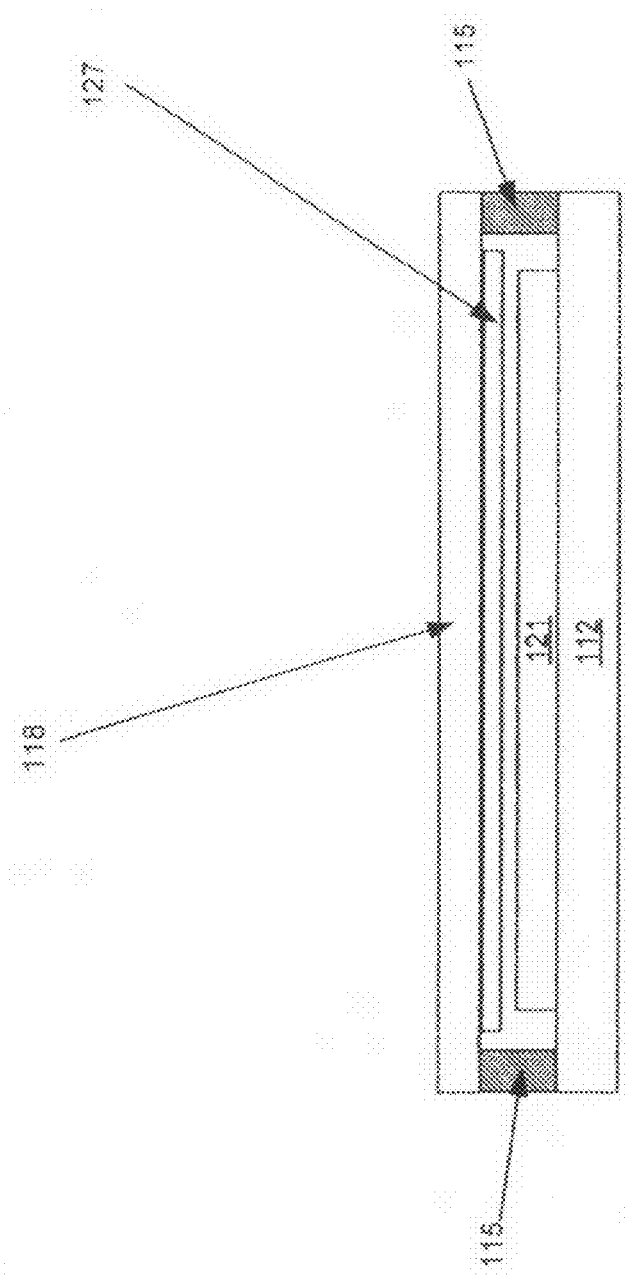
FIG. 1 shows a cross-section of an organic electronic device according to at least one embodiment of the invention.

The invention in at least embodiment consists of a hybrid getter material and the method of making the hybrid getter material. Other embodiments of the invention include OLED and other organic electronic devices which utilize these hybrid getter materials in their fabrication and manufacture. Still other embodiments of the invention include methods of incorporating the hybrid getter material into the encapsulation caps used for the OLED displays. The hybrid getter material is fabricated by combining a high temperature polymer resin with conventional getter material in order to improve the handling characteristics of the getter material. The hybrid getter material can thus be designed such that it is capable of withstanding the getter activation temperature without undue degradation. In at least one embodiment of the invention, the hybrid getter material is fabricated with a zeolite getter powder which is then combined with a polyimide resin. Zeolites are effective getters with high water affinity and capacity. Polyimides have high temperature capability combined with an ability to pick up and transmit water, allowing the vapor to pass to the zeolite.

In other embodiments of the invention, one or more of the following thermally activated getters may be used: Zeolitic clay, Barium Oxide, Calcium Oxide and other reactive or water absorbing oxides, activated carbon or other absorptive organic or inorganic materials. In these and other embodiments of the invention, one or more of the following high temperature resins may be used, including, but not limited to: polyetheretherketone, polybenzoxazole, polyimidobenzoxazole, polyamidether and so on. Any of these and getters and resins may be combined to create a hybrid getter material, but it is preferred that at least one getter material and at least one resin be used in combination.

In one embodiment of the invention, the prepared hybrid getter material is cast into a thin film using conventional casting techniques. In some embodiments of the invention, the size of the hybrid getter film can be anywhere from 5 µm to 250 µm. Subsequent to curing the film via thermal or IR techniques, for instance, the film is stamped or otherwise cut into the appropriate dimensions and shape to fit the display ("hybrid getter coupon"). Alternatively, the hybrid getter film may be made into the final coupon size/shape by screen-printing the hybrid getter material onto a lift-off carrier and then curing. The final coupon is already attained in such cases if the lift-off carrier has a size and shape which enables the cured film to match the desired coupon size and shape. The hybrid getter coupon is adhered to the glass or other encapsulation cap using an adhesive such as a high temperature adhesive. The entire encapsulation cap is subsequently heated to activate the getters within the hybrid getter material. The encapsulation cap with the attached hybrid getter film is then transferred to an inert environment (e.g. a glove box) for assembly onto the OLED display.

In still other embodiments of the invention, the hybrid getter material can be specifically formulated with the appropriate getter and resin mix such that it can be directly deposited (by screen-printing, inkjet or other deposition techniques) onto the encapsulation cap directly. In such embodiments, the hybrid getter material also acts as a binding agent to the encapsulation cap surface. The hybrid getter material can then be then simultaneously or separately cured and activated through thermal, chemical, infrared or other means.

FIG. 1 shows a cross-section of an encapsulated organic electronic device according to at least one embodiment of the invention. An organic electronic device 121 such as, for example, an OLED display is fabricated on a substrate 112. As used within the specification and the claims, the term "on" includes elements that are in physical contact, elements that are "above" elements and separated by air and elements are separated by one or more intervening elements. The organic electronic device 121 can be a device other than the OLED display such as, for example, an OLED light source used for general purpose lighting, an organic light sensor, an organic solar cell array, organic transistor or an organic laser. In the specific case of an OLED display, the display is typically comprised of an anode layer and a cathode layer where the anode layer is typically patterned to form multiple anode strips and the cathode layer is patterned to form multiple cathode strips. The anode strips intersect the cathode strips, and pixels are formed at the intersections of the anode strips and the cathode strips by sandwiching one or more organic layers between the anode strips and the cathode strips.

The organic electronic device 121 is first fabricated on the substrate and then a process known as encapsulation can be applied to it as shown in FIG. 1. In one possible technique of encapsulation, adhesive layer 115 is deposited on an encapsulation lid 118, or on a substrate 112 about the organic electronic device 121. The adhesive layer 115 bonds with the encapsulation lid 118 and the substrate 112, and is deposited such that when the encapsulation lid 118, the adhesive layer 115, and the substrate 112 are brought together, the organic electronic device 121 is sealed. The adhesive layer 115 is comprised of a curable adhesive, preferably, a UV-curable or thermal curable epoxy.

The encapsulation lid 118 is comprised of an opaque, semi-opaque or a non-opaque material. Preferably, the encapsulation lid 118 is comprised of metal, glass, or alternatively plastic with a barrier layer on the plastic. Though not shown, alternatively, the encapsulation lid 118 may be of any suitable shape and may include protrusions to reduce the height needed for adhesive layer 115. The interior side of encapsulation lid 118 faces the organic electronic device 121.

In accordance with at least one embodiment of the invention, a hybrid getter film 127 is attached to the interior side of the encapsulation lid 118 and is disposed above the organic electronic device 121. Though shown not contacting organic electronic device 121, the hybrid getter film 127 may in fact contact the organic electronic device 121 if desired. Once activated, the hybrid getter film 127 absorbs some portion of reactive gasses such as water vapor that may permeate through the adhesive layer 115 or otherwise come into contact with organic electronic device 121. The hybrid getter film 127 is fabricated from a hybrid getter material which is composed of a combination of conventional getter material and a high temperature resin. The hybrid getter film 127 may be attached to the encapsulation lid 118 via a separate adhesive disposed on the encapsulation lid 118, an adhesive mixed in with the hybrid getter material, or by cross-linking to the encapsulation lid 118 or by other suitable means. In other embodiments of the invention, hybrid getter film 127 may be fabricated by depositing hybrid getter material onto the surface of encapsulation lid 118 and then curing the material. In still other embodiments of the invention, the hybrid getter film 127 could be instead deposited and cured upon the top exposed surface of organic electronic device 121. In some embodiments of the invention, the hybrid getter film 127 may include binding agents, cross-linking agents, thermal activation agents and the like. Hybrid getter film 127 is activated thermally, or by applying infrared radiation thereto.

In some embodiments of the invention, the hybrid getter film 127 is composed of zeolite getter powder and polyimide resins. The polyimide resins improve the handling characteristics of the getters, and may also aid in the ability of the hybrid getter film 127 to absorb water. In other embodiments of the invention, one or more of the following thermally activated getters may be used: In these and other embodiments of the invention, one or more of the following high temperature resins may be used, including, but not limited to: polyetheretherketone, polybenzoxazole, polyimidobenzoxazole, polyamidether and so on. Any of these and getters and resins may be combined to create a hybrid getter material, but it is preferred that at least one getter material and at least one resin be used in combination. Exemplary getter materials include one or more of the following thermally activated getters may be used: Zeolitic clay, Barium Oxide, Calcium Oxide and other reactive or water absorbing oxides, activated carbon or other absorptive organic or inorganic materials.

Figure 2:
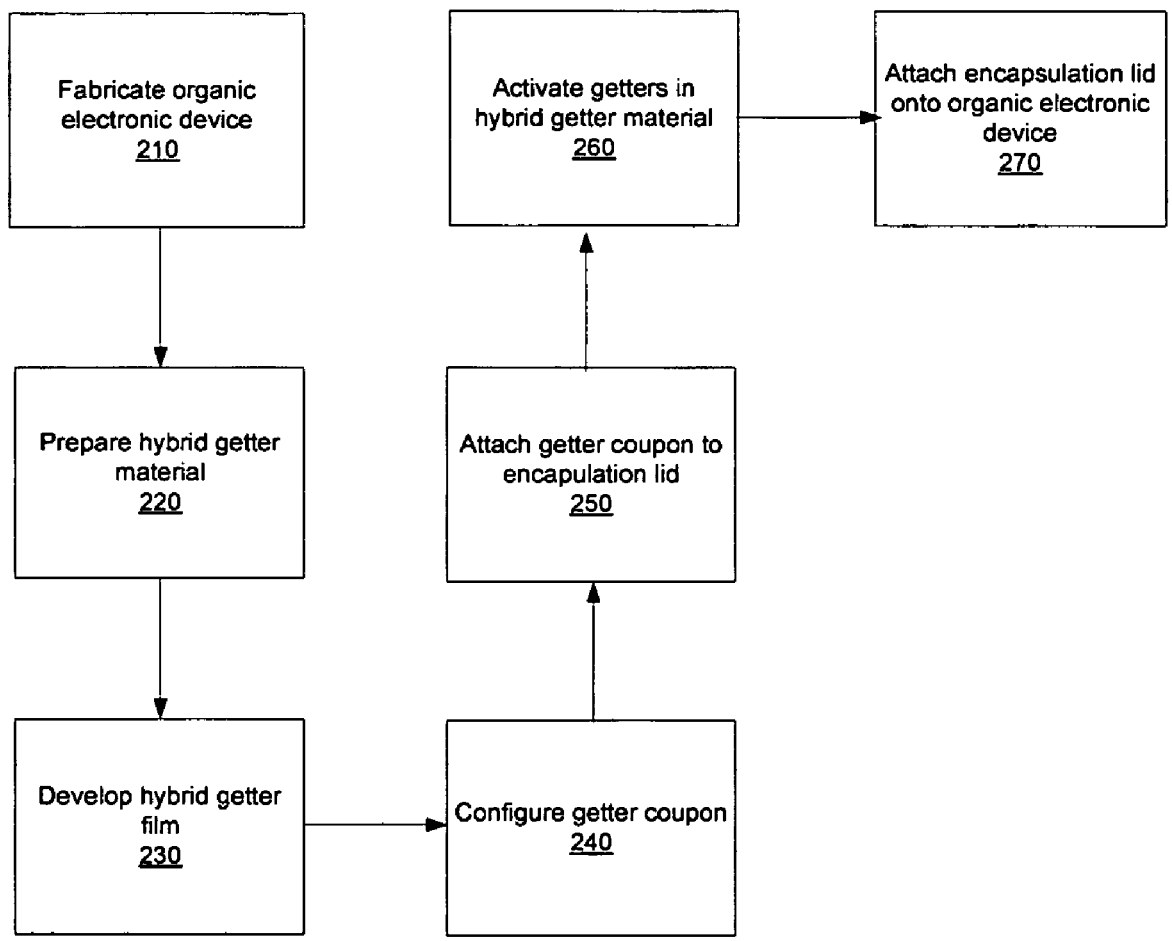
FIG. 2 shows a flowchart of an embodiment of a process to encapsulate the organic optoelectronic device according to the present invention.

FIG. 2 shows a flowchart of an embodiment of the invention. In block 210, an organic electronic device is first fabricated. This is conventionally done over a substrate such as in the case with a OLED device. The organic electronic device can include one or more organic layers as well as one or more inorganic or semi-organic layers. Next, in accordance with the various embodiments of the invention, a hybrid getter material is prepared (block 220). The hybrid getter material is composed of at least one getter material and a resin or other handling improvement agent. The getter material and resin can be mixed together, blended, chemically bonded together, formed into a matrix, cross-linked, and so on. The hybrid getter material can be prepared in batches so that it is readily available for large scale manufacturing. Once the hybrid getter material is prepared, it is developed into a thin film (block 230). The curing process may involve curing by thermal, chemical, infrared or other processes that hardens the hybrid getter material so that it can be handled. In order to achieve a desired size of film, the amount of hybrid getter material can be controlled accordingly, or excess material can be removed to achieve the desired height of film. Next, the getter coupon is configured (block 240). The getter coupon is the result of sizing and shaping the hybrid getter film so that it can be encapsulated in the organic electronic device packaging. The getter coupon may be obtained by stamping or cutting the hybrid getter film into the appropriate or desired size and shape. In other embodiments, blocks 230 and 240 may be combined by screen-printing or depositing the hybrid getter material onto a lift-off carrier, and then curing the material into the film. The size and shape of the cured film can be controlled by designing/selecting the lift-off carrier and by depositing the proper amount of hybrid getter material. The size and shape of the getter coupon will depend upon the size and shape of the encapsulation lid as well as the exposed area of the organic electronic device which may need coverage.

Once the hybrid getter film is configured into a suitable getter coupon, the getter coupon is attached to the encapsulation lid (block 250). The getter coupon can be attached to the encapsulation lid by applying some form of adhesive to either the encapsulation lid or the getter coupon or both. Alternatively, the getter coupon may be "cross-linked" or chemically bound to the material in the encapsulation lid. The process of cross-linking and other chemical bonding techniques are known to those of skill in the art and not a specific subject of the invention. Advantageously, however, any agents or initiators need for cross-linking or chemical bonding processes can be incorporated into the hybrid getter material or the resin and getter powder selected to have such properties as to enable/assist cross-linking, physical adhesion and/or chemical bonding as desired.

Next, the getters within the hybrid getter material (formed into the getter coupon) are activated (block 260). The getters can be activated thermally by heating the encapsulation lid and attached getter coupon, or can be activated by other processes such as by applying infrared or other forms of radiation to the encapsulation lid and getter coupon. The activation process is governed by the type of getters used and any intervening effects of the resin/handling agent used in preparing the hybrid getter material. The activation process may also be performed as part of the attaching the getter coupon to the encapsulation lid (block 250) or even during the curing (developing) of the hybrid getter film (block 230), especially where thermal processes are used throughout.

Finally, the encapsulation lid and attached getter coupon (with activated getters) is attached onto the organic electronic device (block 270). Attaching onto the organic electronic device would include bonding the perimeter of the encapsulation lid on the side of the attached getter coupon with the substrate on which the organic electronic device is fabricated. The attachment process in block 270 can be summarized with respect to the device of FIG. 1 as follows. The adhesive layer 115 is deposited on the encapsulation lid 118, or alternatively, the adhesive layer 115 is deposited on the substrate 112 around a perimeter of the organic electronic device 121. The adhesive layer 115 bonds to both the encapsulation lid 120 and the substrate 112, and is deposited such that when the adhesive layer 115, the encapsulation lid 118, and the substrate 112 are brought together, the organic electronic device 121 is sealed with the getter coupon (hybrid getter film 127).

Almost any type of organic electronic device can be encapsulated with a hybrid getter film as described in various embodiments of the invention. For example, the hybrid getter film can be utilized to protect devices such as an OLED display, OLED lighting source, organic light sensor array, an organic solar cell array, biosensor, DNA chip, organic transistor or an organic laser. The encapsulated OLED display package described earlier can be used within displays in applications such as, for example, computer displays, information displays in vehicles, television monitors, telephones, printers, and illuminated signs.

As any person of ordinary skill in the art of organic optoelectronic device fabrication will recognize from the description, figures, and examples that modifications and changes can be made to the embodiments of the invention without departing from the scope of the invention defined by the following claims.

What is claimed is:

1. An encapsulated device package, comprising:
   a substrate;
   an organic electronic device disposed upon said substrate;
   an encapsulation lid enclosing said organic electronic device by attaching to said substrate; and
   a hybrid getter film attached to said encapsulation lid such that said film faces said organic electronic device within said encapsulated device package, said hybrid getter film being formed of a hybrid getter material of a combination of a getter and a handling agent,
   wherein said combination of the getter and the handling agent forms a chemically bonded, matrix, or cross-linked structure.

2. The encapsulated device package of claim 1 wherein said hybrid getter material is a combination zeolite and handling agent.

3. The encapsulated device package of claim 2 wherein said hybrid getter material is a combination of zeolite and polyimide resin.

4. The encapsulated device package of claim 1 wherein said getter is at least one of a Zeolitic Clay, Barium Oxide, Calcium Oxide, reactive oxides, water absorbing oxides and activated carbon.

5. The encapsulated device package of claim 1 wherein said handling agent includes at least one of polyetheretherketone, polybenzoxazole, polyimidobenzoxazole, polyamidether and polyimide material.

6. The encapsulated device package of claim 1 wherein said organic electronic device is at least one of an OLED display, an organic light sensor array, an organic solar cell array, an organic transistor, a bio-sensor, and an organic laser.

7. The encapsulated device package of claim 1, wherein said combined getter and handling agent forms a chemically bonded structure.

8. The encapsulated device package of claim 1, wherein said combined getter and handling agent forms a matrix structure.

9. The encapsulated device package of claim 1, wherein said combined getter and handling agent forms a cross-linked structure.

* * * * *

UNITED STATES PATENT AND TRADEMARK OFFICE
CERTIFICATE OF CORRECTION

| | | |
|---|---|---|
| PATENT NO. | : 7,589,465 B2 | Page 1 of 1 |
| APPLICATION NO. | : 11/052943 | |
| DATED | : September 15, 2009 | |
| INVENTOR(S) | : Joseph N. Carr | |

It is certified that error appears in the above-identified patent and that said Letters Patent is hereby corrected as shown below:

Column 6, line 12, "by attaching" should be changed to --and being attached--.

Signed and Sealed this
Seventeenth Day of April, 2012

David J. Kappos
*Director of the United States Patent and Trademark Office*